(12) United States Patent
Miura

(10) Patent No.: US 9,678,915 B2
(45) Date of Patent: Jun. 13, 2017

(54) SERIAL COMMUNICATION CONTROL CIRCUIT

(71) Applicant: FANUC Corporation, Yamanashi (JP)

(72) Inventor: Masahiro Miura, Yamanashi (JP)

(73) Assignee: FANUC CORPORATION, Yamanashi (JP)

( * ) Notice: Subject to any disclaimer, the term of this patent is extended or adjusted under 35 U.S.C. 154(b) by 358 days.

(21) Appl. No.: 14/271,609

(22) Filed: May 7, 2014

(65) Prior Publication Data

US 2014/0337548 A1   Nov. 13, 2014

(30) Foreign Application Priority Data

May 8, 2013   (JP) .................................. 2013-098457

(51) Int. Cl.
  *G06F 13/42*    (2006.01)
  *G06F 13/00*    (2006.01)
  *H03M 9/00*     (2006.01)

(52) U.S. Cl.
  CPC .......... *G06F 13/42* (2013.01); *G06F 13/4295* (2013.01); *H03M 9/00* (2013.01)

(58) Field of Classification Search
  CPC ........... G06F 13/42; G06F 13/00; H03M 9/00
  See application file for complete search history.

(56) References Cited

U.S. PATENT DOCUMENTS

| | | | | | |
|---|---|---|---|---|---|
| 5,293,165 A | * | 3/1994 | Iwaki | .................. | H04L 25/4908 341/102 |
| 5,463,639 A | * | 10/1995 | Koishi | ................... | G06F 11/24 702/108 |
| 5,920,704 A | * | 7/1999 | Olnowich | ............. | H04L 7/0338 370/351 |
| 6,684,350 B1 | * | 1/2004 | Theodoras, II | ........... | H04L 1/24 714/712 |
| 6,798,828 B1 | * | 9/2004 | Phanse | ................... | H04B 3/145 375/219 |
| 8,102,288 B2 | * | 1/2012 | Koyanagi | ............... | H03M 9/00 341/100 |
| 8,559,826 B2 | * | 10/2013 | Hongo | ................... | G09G 5/006 348/723 |
| 2003/0115028 A1 | * | 6/2003 | Summerfield | ......... | H04B 10/07 703/6 |

(Continued)

FOREIGN PATENT DOCUMENTS

| JP | 2004-080300 A | 3/2004 |
|---|---|---|
| JP | 2005-064888 A | 3/2005 |

(Continued)

OTHER PUBLICATIONS

Office Action in DE Application No. 102014106185.3, dated Apr. 12, 2016.

*Primary Examiner* — Henry Tsai
*Assistant Examiner* — Christopher A Daley
(74) *Attorney, Agent, or Firm* — Hauptman Ham, LLP

(57) ABSTRACT

In a serial communication control circuit, serial data transmitted from a transmission processing unit is switched to data generated in a mark ratio improvement data generation unit depending on a switch signal from the transmission processing unit, and is transmitted. Thereby, mark ratio improvement data is inserted in a transmission signal to improve a mark ratio during communication, thereby preventing reception signal's jitters from increasing.

14 Claims, 3 Drawing Sheets

(56) References Cited

U.S. PATENT DOCUMENTS

| | | | |
|---|---|---|---|
| 2004/0070524 A1* | 4/2004 | Kurokawa | G11B 20/10009 341/59 |
| 2005/0063707 A1* | 3/2005 | Imai | H04L 25/14 398/141 |
| 2005/0111843 A1* | 5/2005 | Takeuchi | H04B 10/07955 398/38 |
| 2008/0052577 A1* | 2/2008 | Tanaka | H04L 9/0852 714/728 |
| 2009/0296797 A1* | 12/2009 | Wei | H04L 1/244 375/228 |
| 2011/0293047 A1* | 12/2011 | Yamabana | H04B 10/69 375/340 |
| 2013/0208812 A1 | 8/2013 | Hudson et al. | |
| 2013/0322888 A1* | 12/2013 | Furuyama | H04B 10/12 398/141 |

FOREIGN PATENT DOCUMENTS

| | | |
|---|---|---|
| JP | 2012054870 A | 3/2012 |
| WO | 2011/160233 A1 | 12/2011 |
| WO | 2012/153843 A1 | 11/2012 |

* cited by examiner

FIG. 1
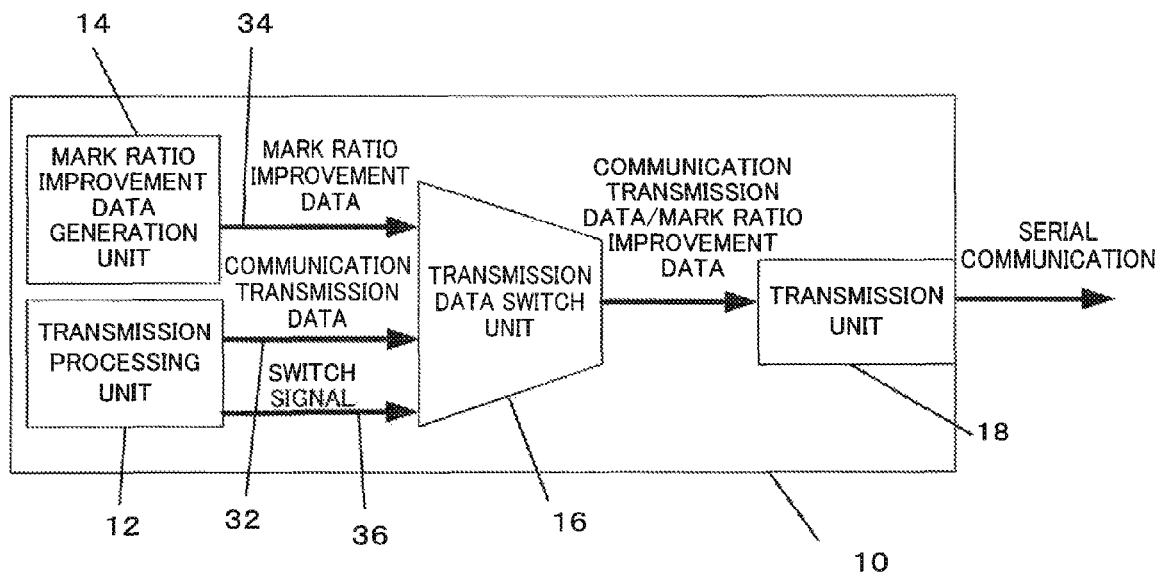
FIG. 2
| 10B | MARK RATIO | DISPARITY |
|---|---|---|
| 0101010101 | 50% | 0 (NEUTRAL) |
FIG. 3
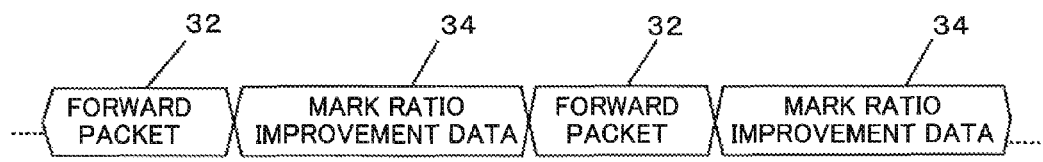

| FORWARD PACKET | MARK RATIO | MARK RATIO IMPROVEMENT DATA TO BE ADDED (MARK RATIO OF 50%) | TOTAL MARK RATIO |
|---|---|---|---|
| 1101010101 | 60% | 0101010101010101 | 53.8% |
| 0101010100 | 40% | 0101010101010101 | 46.2% |

| 10B | MARK RATIO | DISPARITY |
|---|---|---|
| 0101010101 | 50% | 0 (NEUTRAL) |
| 0101010100 | 40% | -2 |
| 1101010101 | 60% | +2 |

| FORWARD PACKET | MARK RATIO | MARK RATIO IMPROVEMENT DATA TO BE ADDED | TOTAL MARK RATIO |
|---|---|---|---|
| 1101010101 | 60% | 0101010100 (MARK RATIO OF 40%) | 50% |
| 0101010100 | 40% | 1101010101 (MARK RATIO OF 60%) | 50% |

SERIAL COMMUNICATION CONTROL CIRCUIT

RELATED APPLICATIONS

The present application claims priority to Japanese Application Number 2013-098457, filed May 8, 2013, the disclosure of which is hereby incorporated by reference herein in its entirety.

BACKGROUND OF THE INVENTION

1. Field of the Invention

The present invention relates to a serial communication control circuit.

2. Description of the Related Art

Serial communication may be employed for transferring various items of data between a piece of industrial equipment such as working machine or robot and a control device for controlling the same. At this time, an encoding scheme such as 4B5B or 8B10B is employed as an encoding scheme for generating a data reproduction clock from received data.

4B5B represents 4-bit data in 5-bit symbol data, and is configured such that at least one 1 is present in 5-bit symbol and the same values are not consecutive for more than 4 bits together with NRZI. 8B10B is such that 8-bit data is divided into upper 3 bits and lower 5 bits, 3B4B conversion for converting 3-bit data into 4-bit symbol data is performed on the upper 3 bits, 5B6B conversion for converting 5-bit data into 6-bit symbol data is performed on the lower 5 bits, and the respectively resultant items of 4-bit and 6-bit data are combined to be 10-bit symbol data. Thereby, the same bits are consecutive for 5 bits or less so that spread of a signal frequency is restricted and stability is improved.

The data subjected to the encoding is designed such that a ratio of the numbers of 0s and is contained in a series of transfer data set is totally kept equal. In the following, the ratio of time occupied by "1" in the series of transfer data set may be denoted as mark ratio (%). A state in which the numbers of is and 0s contained in the series of data set are equal may be called DC balance.

10-bit symbol data in 8B10B may contain five 1s and five 0s, may contain six 1s and four 0s, or may contain four is and six 0s. 8B10B has a running disparity function in which a code to be next transmitted is selected such that the DC balance is kept in consideration of the accumulative numbers of previously transmitted 1s and 0s. However, 4B5B does not have such a function, and if the same transmission data continues, the differences in the numbers of 1s and 0s are accumulated and the DC balance cannot be perfectly kept.

JP 2012-54870 A discloses that when a reception circuit receives data with a high or low mark ratio, pulse output is consequently distorted as a result of controlling a threshold to be higher or lower, and data with a high or low mark ratio needs to be transmitted and received for a sufficiently long time in order to acquire deterioration determination information when the distortion of pulse output is the largest.

Serial communication may utilize an AC coupling, or capacitive coupling termination form in which capacitors are inserted in series on a data signal line in order to secure specifications' compatibility or to enhance a noise margin. In the AC coupling, if the DC balance cannot be kept, an average level of the signal cannot be kept at a half voltage of the amplitude, and signal jitters may increase on the reception side.

With the technique disclosed in JP 2012-54870 A, a deteriorated site can be determined by phase data determination, but a mark ratio of data is not adjusted and thus reception signal's jitters may increase.

SUMMARY OF THE INVENTION

It is therefore an object of the present invention to provide a serial communication circuit for improving a mark ratio during communication and for preventing reception signal's jitters from increasing.

A serial communication control circuit according to the present invention is directed for transmitting and receiving encoded data, and comprises a transmission processing unit for generating serial data to be transmitted, and a mark ratio improvement data generation unit for generating mark ratio improvement data in addition to the generated transmission data. Further, the serial communication control circuit includes a transmission data switch unit for switching and transmitting serial data transmitted from the transmission processing unit to data generated in the mark ratio improvement data generation unit when a switch signal is output from the transmission processing unit.

Thereby, mark ratio improvement data is inserted in a transmission signal thereby to improve the mark ratio during communication, thereby preventing reception signal's jitters from increasing.

The serial communication control circuit comprises a mark ratio detection unit for finding a mark ratio of transmission data output from the transmission data switch unit, wherein the mark ratio improvement data generation unit receives a mark ratio output from the mark ratio detection unit, and determines a mark ratio of mark ratio improvement data to be generated.

Thereby, a mark ratio of transmission data is detected and a mark ratio of mark ratio improvement data is determined depending on the detected mark ratio, thereby more effectively improving a mark ratio during communication and preventing reception signal's jitters from increasing.

The present invention has the above structure thereby to provide a serial communication circuit capable of improving a mark ratio during communication and preventing reception signal's jitters from increasing.

BRIEF DESCRIPTION OF THE DRAWINGS

The above and other objects and features of the present invention will be apparent from the following description of embodiments with reference to the accompanying drawings.

FIG. 1 is a block diagram of a serial communication control circuit according to a first embodiment;

FIG. 2 is a diagram illustrating exemplary mark ratio improvement data according to the first embodiment;

FIG. 3 is a diagram illustrating an example in which mark ratio improvement data is inserted between forward packets according to the first embodiment;

FIGS. 5A to 5C are diagrams illustrating a mark ratio improvement data insertion method according to a second embodiment;

Figures 4, 5:
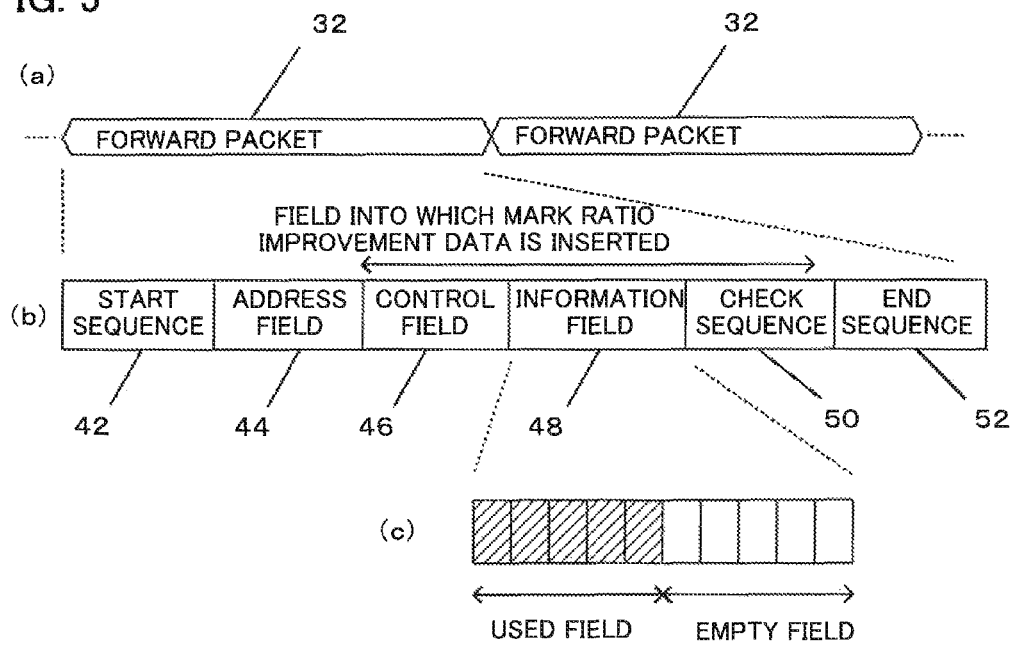
FIG. 4 is a diagram illustrating improvements in a mark ratio by inserted mark ratio improvement data according to the first embodiment.

DETAILED DESCRIPTION OF THE PREFERRED EMBODIMENTS (First Embodiment)

FIG. 1 is a block diagram of a serial communication control circuit according to a first embodiment. Numeral 12 denotes a transmission processing unit, and the transmission processing unit generates encoded communication transmission data (i.e., forward packets) 32 and a switch signal 36 described later, and transmits them to a transmission data switch unit 16. Numeral 14 denotes a mark ratio improvement data generation unit, and the mark ratio improvement data generation unit generates mark ratio improvement data 34 and transmits it to the transmission data switch unit 16. The transmission data switch unit 16 selects either the communication transmission data (i.e., forward packets) 32 from the transmission processing unit 12 or the mark ratio improvement data 34 from the mark ratio improvement data generation unit 14 depending on the switch signal 36 transmitted from the transmission processing unit 12, and transmits it to a transmission unit 18, and the transmission unit 18 receiving either data sends a signal to the outside via serial communication.

FIG. 2 illustrates exemplary mark ratio improvement data 34 according to the first embodiment. In the present embodiment, as illustrated in FIG. 2, the mark ratio improvement data 34 uses data with a mark ratio of 50% in which a disparity or a difference in the numbers of 1s and 0s in a code is 0 or neutral.

FIG. 3 illustrates an example in which the mark ratio improvement data 34 is inserted between the random-interval forward packets 32. Control information such as data length or error correction code in addition to data is added to the forward packet 32. The forward packet 32 is generated in the transmission processing unit 12, and thus the transmission processing unit 12 can grasp in which time zone the forward packet 32 is transmitted or in which time zone the forward packet 32 is not transmitted. Thus, the serial communication control circuit transmits the switch signal 36 from the transmission processing unit 12 to the transmission data switch unit 16 and switches the data to be transmitted to the transmission data switch unit 16 between the communication transmission data, that is, forward packet 32 from the transmission processing unit 12 and the mark ratio improvement data 34 from the mark ratio improvement data generation unit 14 at transmission start and transmission end of the forward packet 32.

FIG. 4 illustrates improvements in a mark ratio by inserted mark ratio improvement data 34 according to the present embodiment. The forward packet 32 in the upper example is 10 bits of 1101010101 and its mark ratio is 60%, but when 16-bit mark ratio improvement data 34 of 0101010101010101 is inserted between the forward packets 32, a total mark ratio is 14/26 or 53.8%, and the mark ratio is improved as compared with 60% before the insertion.

The forward packet 32 in the lower example is 10 bits of 0101010100 and its mark ratio is 40%, but when 16-bit mark ratio improvement data 34 of 0101010101010101 is inserted between the forward packets 32, a total mark ratio is 12/26 or 46.2%, and the mark ratio is improved as compared with 40% before the insertion. In this way, the mark ratio improvement data is transmitted depending on traffic in the serial transmission path, thereby preventing jitters from occurring on the reception side.

The examples illustrated in FIG. 4 are merely exemplary insertion of the mark ratio improvement data 34, and the forward packet 32 and the mark ratio improvement data 34 are not necessarily 10 bits and 16 bits, respectively. Actually, the data length of the forward packet 32 variably changes, and the length between the forward packets 32 is not constant. As many items of mark ratio improvement data 34 as possible are inserted between the forward packets 32, thereby keeping even more the DC balance.

(Second Embodiment)

A second embodiment is similar to the first embodiment in the structure of the serial control communication control circuit and in that the mark ratio improvement data 34 to be inserted has a mark ratio of 50%, but is different therefrom in a method for inserting mark ratio improvement data between the forward packets 32.

FIGS. 5A to 5C illustrate a mark ratio improvement data insertion method according to the second embodiment, and illustrate an example in which mark ratio improvement data is inserted in an unnecessary part in a packet during periodical packet transfer.

In a communication protocol ensuring a real-time property, all the units have to be completely communicated within a period determined by a specification. For example, there is assumed a protocol that packets are periodically transferred to go round all the units in the cycle. In this case, when there is a unit which does not need to be transferred in a shortest cycle among the units or when the number of connected slaves is small relative to the maximum number of slaves, a vacancy occurs in any field in many cases. Mark ratio improvement data is inserted in the empty field while a protocol format is met.

As illustrated in FIG. 5A, the forward packets 32 are periodically transmitted according to the present embodiment. As illustrated in FIG. 5B, an individual forward packet 32 consists of a start sequence 42, an address field 44, a control field 46, an information field 48, a check sequence 50 and an end sequence 52.

FIG. 5C illustrates an exemplary internal structure of the information field 48. As illustrated in FIG. 5C, the information field 48 contains as many fields as corresponding to up to 10 slaves, but when the number of actually connected slaves is 5, only the shaded part in the information field is used and the rest is empty. There is described herein an example in which less slaves than the maximum number of slaves are connected in the information field 48, but also when there is a unit which does not need to be transferred in a shortest cycle among the units, a vacancy occurs in the field. A vacancy occurs in not only the information field 48 but also the control field 46 or the check sequence 50 for the same reason, and thus the mark ratio improvement data 34 may be inserted in the empty part.

The forward packet 32 is generated in the transmission processing unit 12 which grasps empty fields, and thus the transmission processing unit 12 can propagate a switch signal to the transmission data switch unit while grasping empty fields.

In this way, it is possible to transmit mark ratio improvement data and to prevent jitters from occurring on the reception side depending on a vacancy of a field in a packet.

(Third Embodiment)

Figures 6, 7, 8:
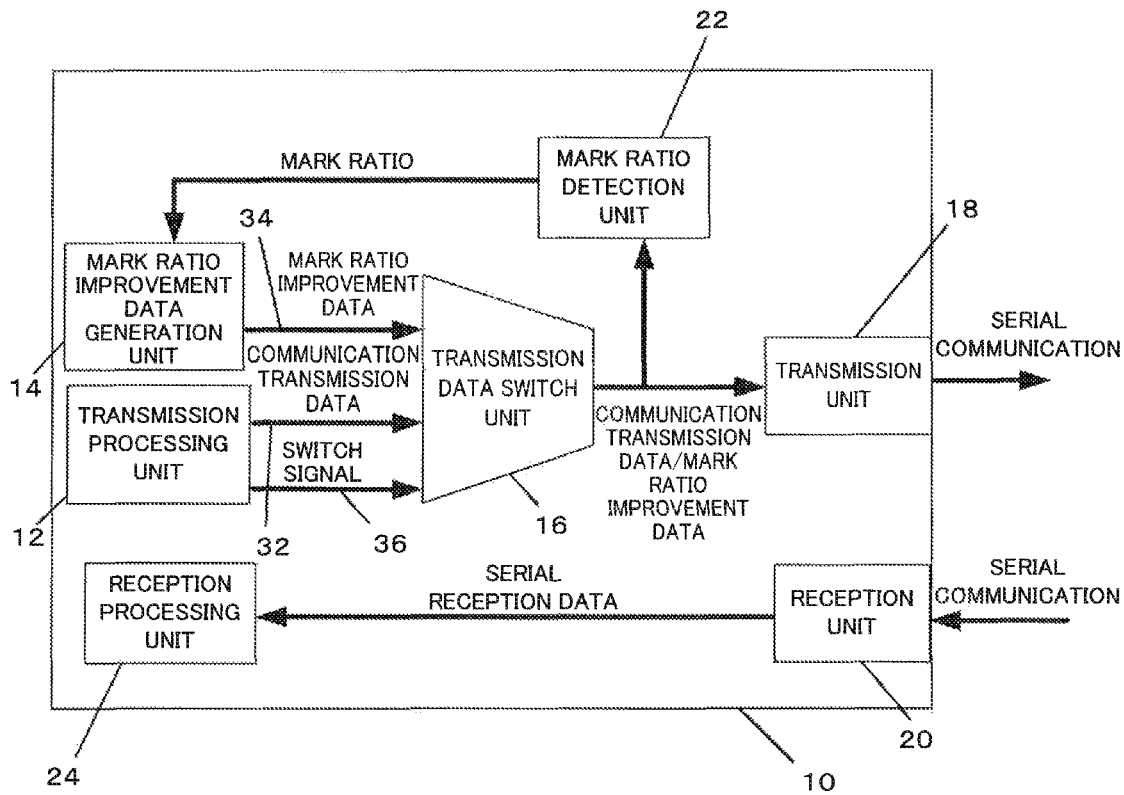
FIG. 6 is a block diagram of a serial communication control circuit according to a third embodiment.
FIG. 7 is a diagram illustrating exemplary mark ratio improvement data according to the third embodiment.
FIG. 8 is a diagram illustrating improvements in a mark ratio by inserted mark ratio improvement data according to the third embodiment.

FIG. 6 is a block diagram of the serial communication control circuit according to a third embodiment. Numeral 12 denotes a transmission processing unit, and the transmission processing unit generates encoded communication transmission data (i.e., forward packets) 32 and a switch signal 36 described later, and transmits them to the transmission data switch unit 16. Numeral 14 denotes a mark ratio improvement data generation unit, and the mark ratio improvement data generation unit receives a mark ratio data transmitted from a mark ratio detection unit 22 described later, and generates and transmits mark ratio improvement data 34 depending on the mark ratio to the transmission data switch unit 16. The transmission data switch unit 16 selects either the communication transmission data (i.e., forward packets) 32 from the transmission processing unit 12 or the mark ratio improvement data 34 from the mark ratio improvement data generation unit 14 depending on the switch signal 36 transmitted from the transmission processing unit 12, and transmits the data to the transmission unit 18, and the transmission unit 18 receiving either data transmits the data to the outside via serial communication.

Numeral 22 denotes a mark ratio detection unit, and the mark ratio detection unit detects a mark ratio of the transmission data transmitted from the transmission data switch unit 16. The mark ratio detection method includes counting 0s and 1s in a digital manner, or detecting them in an analog manner. A mark ratio detected by the mark ratio detection unit 22 is transmitted to the mark ratio improvement data generation unit 14. Further, data transmitted from the outside via serial communication is received in a reception unit 20 and is transmitted to a reception processing unit 24.

The serial communication control circuit according to the present embodiment is different from the first embodiment in that the mark ratio detection unit 22 for finding a mark ratio of encoded transmission data, and the mark ratio improvement data generation unit 14 for receiving a mark ratio output from the mark ratio detection unit 22, determining a mark ratio of mark ratio improvement data 34 to be inserted, and outputting the mark ratio improvement data 34 are provided therein.

Like the aforementioned 4B5B code, also for a code non considering a running disparity, a running disparity can be calculated in the mark ratio improvement data generation unit and mark ratio improvement data for keeping the DC balance can be generated and transmitted, and thus a jitter suppression effect on the reception side can be expected.

The mark ratio improvement data 34 according to the present embodiment will be described with reference to FIG. 7 and FIG. 8. FIG. 7 illustrates exemplary mark ratio improvement data 34 in 8B10B. As illustrated in FIG. 7, three items of mark ratio improvement data 34 are employed in the present embodiment, which include data with a disparity of 0 or neutral and a mark ratio of 50%, data with a disparity of −2 and a mark ratio of 40%, and data with a disparity of +2 and a mark ratio of 60%.

The mark ratio improvement data generation unit 14 determines which mark ratio improvement data 34 is to be used depending on a value of the mark ratio transmitted from the mark ratio detection unit 22. Specifically, the mark ratio improvement data generation unit 14 uses mark ratio improvement data 34 with a mark ratio of 40% when the mark ratio is 55% or more, or mark ratio improvement data 34 with a mark ratio of 60% when the mark ratio is 45% or less, or mark ratio improvement data 34 with a mark ratio of 50% when the mark ratio is between 45% and 55% thereby to select mark ratio improvement data 34 so as to eliminate a varied mark ratio.

For insertion of mark ratio improvement data 34 according to the present embodiment, the mark ratio improvement data 34 may be inserted between the random-interval transfer packets as in the first embodiment, or the mark ratio improvement data may be inserted in an unnecessary part in a packet during periodical packet transfer as in the second embodiment.

FIG. 8 illustrates improvements in a mark ratio by inserted mark ratio improvement data 34 according to the present embodiment. In the upper example of FIG. 8, the forward packet 32 is 10 bits of 1101010101 and its mark ratio is 60%, but when mark ratio improvement data 34 with 10 bits of 0101010100 and a mark ratio of 40% is inserted between the forward packets 32, a total mark ratio is 10/20 or 50%. In the lower example of FIG. 8, the forward packet 32 is 10 bits of 0101010100 and its mark ratio is 40%, but when mark ratio improvement data 34 with 10 bits of 1101010101 and a mark ratio of 60% is inserted between the forward packets 32, a total mark ratio is 10/20 or 50%. In this way, mark ratio improvement data is transmitted depending on traffic of the serial transmission path, thereby preventing jitters from occurring on the reception side.

The examples illustrated in FIG. 8 are merely exemplary insertion of mark ratio improvement data 34, and the forward packet 32 and the mark ratio improvement data 34 are not necessarily 10 bits, respectively. Actually, the data length of the forward packet 32 variably changes and the length between the forward packets 32 is not constant. As many items of mark ratio improvement data 34 as possible are inserted between the forward packets 32, thereby keeping even more the DC balance.

The invention claimed is:

1. A serial communication control circuit for transmitting and receiving encoded data including forward packets, the serial communication control circuit comprising:
   a transmission processing unit configured to generate the forward packets of serial data to be transmitted, the transmission processing unit being configured to determine a time period when none of the forward packets is transmitted;
   a mark ratio improvement data generation unit configured to generate mark ratio improvement data in addition to the generated forward packets of the serial data; and
   a transmission data switch unit configured to
      transmit the forward packets of the serial data transmitted from the transmission processing unit, and
      in response to a switch signal output from the transmission processing unit, switch the forward packets of the serial data to the mark ratio improvement data generated in the mark ratio improvement data generation unit,
   wherein the transmission processing unit is configured to generate the switch signal, in the time period when none of the forward packets is transmitted.

2. The serial communication control circuit according to claim 1, further comprising:
   a mark ratio detection unit configured to detect a mark ratio of transmission data output from the transmission data switch unit,
   wherein the mark ratio improvement data generation unit is further configured to
      receive the detected mark ratio output from the mark ratio detection unit, and
      generate the mark ratio improvement data in accordance with the detected mark ratio.

3. The serial communication control circuit according to claim 2, wherein the mark ratio detection unit is configured to count the mark ratio in a digital manner.

4. The serial communication control circuit according to claim 2, wherein the mark ratio detection unit is configured to count the mark ratio in an analog manner.

5. The serial communication control circuit according to claim 1, wherein the mark ratio improvement data includes
(1) data with a disparity of 0 and a mark ratio of 50%,
(2) data with a disparity of −2 and a mark ratio of 40%, and
(3) data with a disparity of +2 and a mark ratio of 60%.

6. The serial communication control circuit according to claim 2, wherein the mark ratio improvement data generation unit is configured to use, as the mark ratio improvement data to be generated:
mark ratio improvement data with a mark ratio of 40% when the detected mark ratio is 55% or more,
mark ratio improvement data with a mark ratio of 60% when the detected mark ratio is 45% or less, and
mark ratio improvement data with a mark ratio of 50% when the detected mark ratio is between 45% and 55%.

7. The serial communication control circuit according to claim 1, wherein the transmission data switch unit configured to insert the mark ratio improvement data between the forward packets at a random interval.

8. A serial communication control circuit for transmitting and receiving encoded data including forward packets, the serial communication control circuit comprising:
a transmission processing unit configured to generate the forward packets of serial data to be transmitted;
a mark ratio improvement data generation unit configured to generate mark ratio improvement data in addition to the generated forward packets of the serial data; and
a transmission data switch unit configured to
transmit the forward packets of the serial data transmitted from the transmission processing unit, and
in response to a switch signal output from the transmission processing unit, switch the forward packets of the serial data to the mark ratio improvement data generated in the mark ratio improvement data generation unit,
wherein the transmission processing unit is configured to generate the switch signal at a time when an empty field of one of the forward packets starts.

9. The serial communication control circuit according to claim 8, wherein
the transmission processing unit is configured to generate the switch signal at the time when the empty field of one of the forward packets starts within a period determined by a specification according to a communication protocol that ensures a real-time property.

10. The serial communication control circuit according to claim 8, further comprising:
a mark ratio detection unit configured to detect a mark ratio of transmission data output from the transmission data switch unit,
wherein the mark ratio improvement data generation unit is further configured to
receive the detected mark ratio output from the mark ratio detection unit, and
generate the mark ratio improvement data in accordance with the detected mark ratio.

11. The serial communication control circuit according to claim 10, wherein the mark ratio detection unit is configured to count the mark ratio in a digital manner.

12. The serial communication control circuit according to claim 10, wherein the mark ratio detection unit is configured to count the mark ratio in an analog manner.

13. The serial communication control circuit according to claim 10, wherein the mark ratio improvement data generation unit is configured to use, as the mark ratio improvement data to be generated:
mark ratio improvement data with a mark ratio of 40% when the detected mark ratio is 55% or more,
mark ratio improvement data with a mark ratio of 60% when the detected mark ratio is 45% or less, and
mark ratio improvement data with a mark ratio of 50% when the detected mark ratio is between 45% and 55%.

14. The serial communication control circuit according to claim 8, wherein the mark ratio improvement data includes
(1) data with a disparity of 0 and a mark ratio of 50%,
(2) data with a disparity of −2 and a mark ratio of 40%, and
(3) data with a disparity of +2 and a mark ratio of 60%.

* * * * *